United States Patent
Watanabe et al.

(10) Patent No.: US 8,614,465 B2
(45) Date of Patent: *Dec. 24, 2013

(54) ELECTRONIC DEVICE AND MANUFACTURING METHOD

(75) Inventors: Daisuke Watanabe, Saitama (JP);
Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 3 days.

This patent is subject to a terminal disclaimer.

(21) Appl. No.: 13/027,977

(22) Filed: Feb. 15, 2011

(65) Prior Publication Data

US 2011/0193138 A1 Aug. 11, 2011

Related U.S. Application Data

(63) Continuation of application No. PCT/JP2008/069374, filed on Oct. 24, 2008.

(51) Int. Cl.
*H01L 29/66* (2006.01)

(52) U.S. Cl.
USPC ............. 257/252; 257/77; 257/282; 257/488; 257/529; 257/494; 257/655; 438/478

(58) Field of Classification Search
USPC ............. 257/252, 77, 282, 488, 139, 529, 21, 257/140, 494, 655; 438/478
See application file for complete search history.

(56) References Cited

U.S. PATENT DOCUMENTS

| | | | |
|---|---|---|---|
| 3,758,794 A * | 9/1973 | Kosonocky ...................... 377/63 |
| 4,292,729 A * | 10/1981 | Powell ........................... 438/725 |
| 4,317,084 A * | 2/1982 | Senturia et al. .................. 331/57 |
| 4,450,537 A * | 5/1984 | Oldham ......................... 365/217 |
| 4,646,119 A * | 2/1987 | Kosonocky ...................... 377/60 |
| 4,672,412 A * | 6/1987 | Wei et al. ....................... 257/448 |
| 5,360,988 A * | 11/1994 | Uda et al. ....................... 257/529 |
| 5,414,272 A * | 5/1995 | Watanabe et al. ............... 257/10 |
| 5,497,146 A * | 3/1996 | Hebiguchi .................. 340/14.63 |
| 5,519,658 A * | 5/1996 | Uda et al. ....................... 365/200 |

(Continued)

FOREIGN PATENT DOCUMENTS

| | | |
|---|---|---|
| JP | 5-114699 A | 5/1993 |
| JP | 7-249688 A | 9/1995 |
| JP | 11-17017 A | 1/1999 |
| JP | 2001-7660 A | 1/2001 |

OTHER PUBLICATIONS

International Search Report (ISR) issued in PCT/JP2008/069374 (parent application) mailed in Jan. 2009 for Examiner consideration, citing Foreign Patent document Nos. 2-4.

(Continued)

*Primary Examiner* — Fernando L Toledo
*Assistant Examiner* — Mohammed Shamsuzzaman

(57) ABSTRACT

Provided is an electronic device that generates an output signal corresponding to an input signal, comprising a signal processing section that receives the input signal and outputs the output signal corresponding to the input signal, and a floating electrode that accumulates a charge by being irradiated by an electron beam. The signal processing section adjusts electric characteristics of the output signal according to a charge amount accumulated in the floating electrode, and includes a transistor formed on the semiconductor substrate between an input terminal that receives the input signal and an output terminal that outputs the output signal. The floating electrode is formed between a gate electrode of the transistor and the semiconductor substrate.

6 Claims, 8 Drawing Sheets

(56) References Cited

U.S. PATENT DOCUMENTS

| | | | | |
|---|---|---|---|---|
| 5,604,355 | A * | 2/1997 | Van Zutphen | 257/10 |
| 5,760,417 | A * | 6/1998 | Watanabe et al. | 257/11 |
| 5,900,654 | A * | 5/1999 | Spratt | 257/222 |
| 5,969,400 | A * | 10/1999 | Shinohe et al. | 257/492 |
| 6,008,576 | A * | 12/1999 | Nakatani et al. | 313/495 |
| 6,054,748 | A * | 4/2000 | Tsukuda et al. | 257/496 |
| 6,355,493 | B1 * | 3/2002 | Usenko | 438/4 |
| 6,599,781 | B1 * | 7/2003 | Li | 438/142 |
| 6,859,031 | B2 * | 2/2005 | Pakdaman et al. | 324/233 |
| 6,900,483 | B2 * | 5/2005 | Uchida et al. | 257/280 |
| 7,075,593 | B2 * | 7/2006 | Vidal et al. | 349/31 |
| 7,358,113 | B2 * | 4/2008 | Shrivastava et al. | 438/99 |
| 7,759,698 | B2 * | 7/2010 | Ogura | 257/185 |
| 7,791,082 | B2 * | 9/2010 | Iwasaki | 257/79 |
| 8,222,696 | B2 * | 7/2012 | Yamazaki et al. | 257/347 |
| 2002/0126233 | A1 | 9/2002 | Yamagishi et al. | 349/43 |
| 2004/0169622 | A1 | 9/2004 | Matsuura et al. | 345/76 |
| 2006/0046385 | A1 * | 3/2006 | Fujii | 438/257 |
| 2006/0145241 | A1 * | 7/2006 | Forbes et al. | 257/315 |
| 2006/0157802 | A1 * | 7/2006 | Sakamoto et al. | 257/393 |
| 2006/0250067 | A1 * | 11/2006 | Nanataki et al. | 313/311 |
| 2007/0147151 | A1 * | 6/2007 | Kurokawa | 365/205 |
| 2007/0194297 | A1 * | 8/2007 | McCarthy et al. | 257/14 |
| 2008/0171411 | A1 * | 7/2008 | Takata et al. | 438/197 |
| 2008/0191196 | A1 * | 8/2008 | Lu et al. | 257/27 |
| 2009/0127589 | A1 * | 5/2009 | Rothberg et al. | 257/253 |
| 2010/0021933 | A1 * | 1/2010 | Okano et al. | 435/7.1 |
| 2010/0276733 | A1 * | 11/2010 | Li | 257/252 |
| 2010/0308326 | A1 * | 12/2010 | Kim et al. | 257/43 |
| 2011/0079817 | A1 * | 4/2011 | Ohara | 257/103 |
| 2011/0242895 | A1 * | 10/2011 | Okayasu et al. | 365/185.18 |
| 2011/0248320 | A1 * | 10/2011 | Rothberg et al. | 257/253 |
| 2011/0285427 | A1 * | 11/2011 | Koyama et al. | 327/109 |
| 2012/0058599 | A1 * | 3/2012 | Yamazaki et al. | 438/104 |
| 2012/0088682 | A1 * | 4/2012 | Rothberg et al. | 506/9 |
| 2012/0097980 | A1 * | 4/2012 | Masuda et al. | 257/77 |
| 2012/0256193 | A1 * | 10/2012 | Hebert et al. | 257/77 |

OTHER PUBLICATIONS

Written Opinion (PCT/ISA/237) issued in PCT/JP2008/069374 (parent application) mailed in Jan. 2009.
TW Office Action/ Search Report and Computer Translation Dated Nov. 8, 2012; Application No. 098135805.
JP Office Action/ Search Report and Computer Translation Dated Apr. 23, 2013; Application No. 2010-534647.

* cited by examiner

ELECTRONIC DEVICE AND MANUFACTURING METHOD

BACKGROUND

1. Technical Field

The present invention relates to an electronic device and a manufacturing method.

2. Related Art

An electronic device such as a semiconductor circuit includes a circuit that performs prescribed signal processing on an input signal. For example, an electronic device may include a circuit that delays the input signal or a circuit that changes the amplitude of the input signal. These signal processing circuits are formed to have prescribed characteristics, as shown in Patent Document 1, for example.

Patent Document 1: Japanese Patent Application Publication No. 2001-7660

However, due to variations in the manufacturing of the signal processing circuits, the characteristics thereof can deviate from the prescribed characteristics. For example, etching variation of impurity density variation occurring in the process for forming the semiconductor circuits can cause an error in the characteristics of the signal processing circuits.

SUMMARY

Therefore, it is an object of an aspect of the innovations herein to provide an electronic device and a manufacturing method, which are capable of overcoming the above drawbacks accompanying the related art. The above and other objects can be achieved by combinations described in the independent claims. According to a first aspect related to the innovations herein, provided is an electronic device that generates an output signal corresponding to an input signal, comprising a signal processing section that receives the input signal and outputs the output signal corresponding to the input signal, and a floating electrode that accumulates a charge by being irradiated by an electron beam. The signal processing section adjusts electric characteristics of the output signal according to a charge amount accumulated in the floating electrode.

According to a second aspect related to the innovations herein, provided is a manufacturing method for manufacturing an electronic device that generates an output signal corresponding to an input signal. The method comprises forming a floating electrode that accumulates a charge by being irradiated by an electron beam; forming a signal processing section that receives the input signal, generates the output signal corresponding to the input signal, and adjusts electric characteristics of the output signal according to a charge amount accumulated in the floating electrode; testing operation of the signal processing section; and irradiating the floating electrode with the electron beam according to the test results of the signal processing section.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
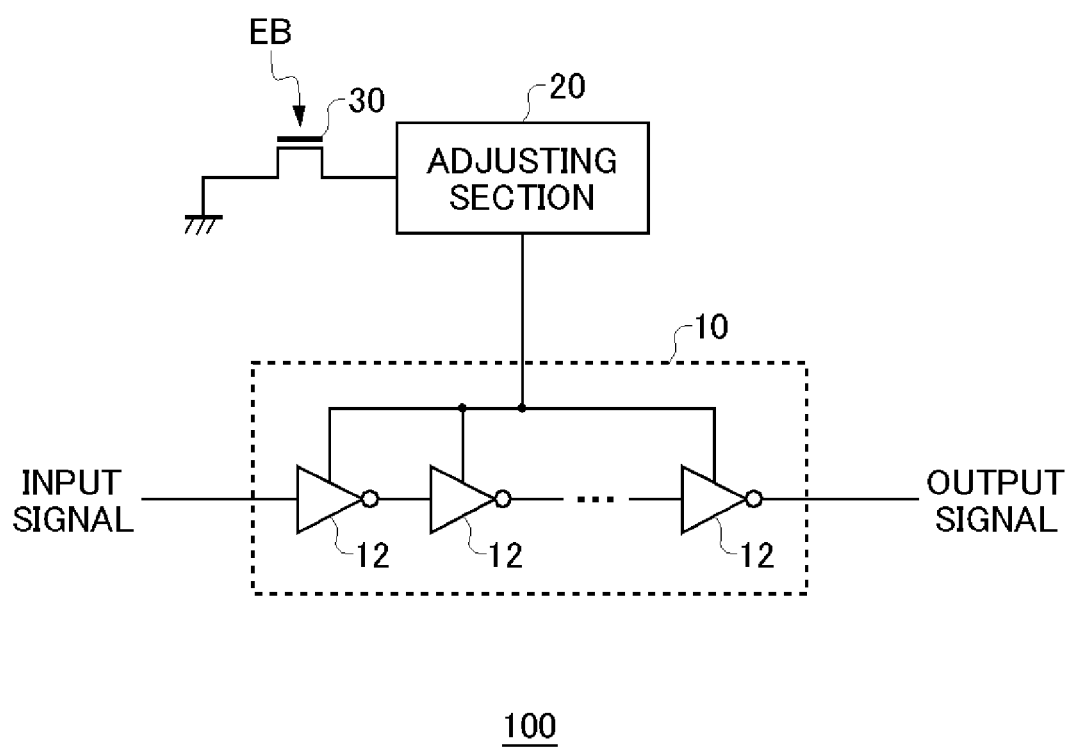
FIG. 1 shows an exemplary configuration of an electronic device 100 according to an embodiment of the present invention.

FIG. 1 shows an exemplary configuration of an electronic device 100 according to an embodiment of the present invention. The electronic device 100 generates an output signal by applying prescribed signal processing to an input signal. The electronic device 100 of the present embodiment includes a signal processing section 10, an adjusting section 20, and a floating electrode 30. The electronic device 100 may be a semiconductor circuit formed on a semiconductor substrate.

The signal processing section 10 receives the input signal and generates the output signal by applying the prescribed signal processing to the input signal. As shown in FIG. 1, the signal processing section 10 may be a delay circuit that includes a plurality of delay elements 12 in cascade. The signal processing section 10 of the present embodiment generates an output signal obtained by delaying the input signal by a prescribed delay amount. The delay amount of the signal processing section 10 may change according to a bias voltage supplied to the delay elements 12.

The floating electrode 30 accumulates a charge by being irradiated with an electron beam. For example, the floating electrode 30 may accumulate a charge amount corresponding to the current density and emission time of the electron beam.

The adjusting section 20 adjusts the electrical characteristics of the output signal from the signal processing section 10, according to the charge amount accumulated in the floating electrode 30. The adjusting section 20 of the present embodiment adjusts the delay amount of the signal processing section 10 by adjusting the bias voltage applied to the delay elements 12 according to the charge amount accumulated in the floating electrode 30.

The adjusting section 20 may receive an analog voltage corresponding to the charge amount accumulated in the floating electrode 30, and adjust the bias voltage supplied to the delay elements 12 based on this analog voltage. The adjusting section 20 may receive a digital value corresponding to the charge amount accumulated in the floating electrode 30, and adjust the bias voltage applied to the delay elements 12 based on this digital value.

The floating electrode 30 may generate a binary digital value indicating whether the electron beam is radiated. In order to generate a multi-bit digital value, the electronic device 100 may include a plurality of floating electrodes 30 for a single signal processing section 10. If the electronic device 100 includes a plurality of signal processing sections 10, a floating electrode 30 may be provided for each signal processing section 10. Similarly, a plurality of floating electrodes 30 may be provided for a single adjusting section 20.

The floating electrode 30 is irradiated with the electron beam such that the electric characteristics of the output signal from the signal processing section 10 become prescribed characteristics. For example, an external apparatus may measure the electric characteristics of the output signal, and an external electron beam emission apparatus may irradiate the floating electrode 30 with the electron beam based on the measured electric characteristics.

In order to hold the charge amount received from the electron beam, the floating electrode 30 is insulated from the ground potential, wiring, electrodes, and other electronic components. The floating electrode 30 is formed in a manner to enable irradiation thereof by the electron beam. A via hole through which the electron beam passes may be formed on an insulating film covering the floating electrode 30.

The floating electrode 30 may be formed to be able to receive the electron beam during at least a portion of the manufacturing process. In this case, the electric characteristics of the signal processing section 10 may be measured and the floating electrode 30 may be irradiated with the electron beam during the manufacturing of the electronic device 100. In this case, in the completed electronic device 100, the floating electrode 30 need not be able to receive the electron beam. With the above configuration, the electric characteristics of the signal processing section 10 can be adjusted to be prescribed characteristics.

Figure 2:
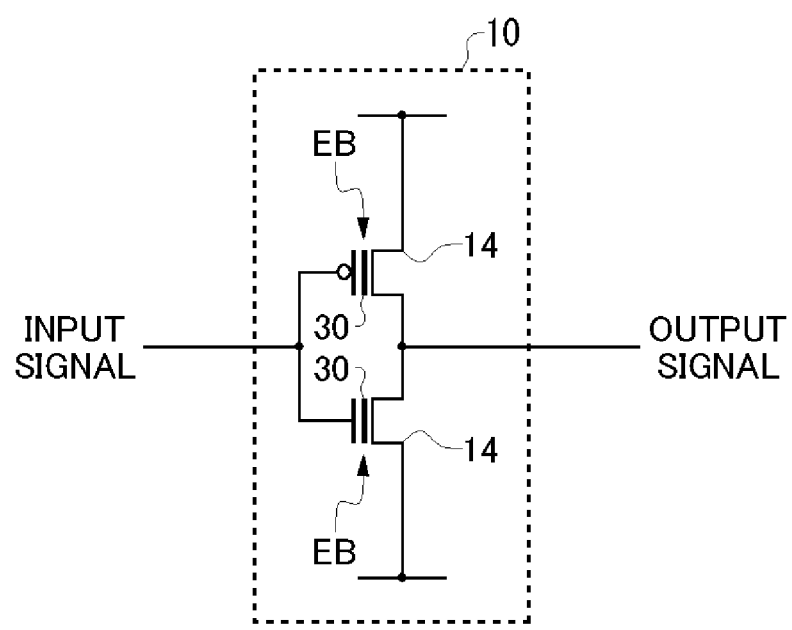
FIG. 2 shows another exemplary configuration of the electronic device 100.

FIG. 2 shows another exemplary configuration of the electronic device 100. The electronic device 100 of the present embodiment includes floating electrodes 30 formed in the signal processing section 10. The floating electrodes 30 may be provided to transistors 14 formed in the signal processing section 10. In this case, the electronic device 100 need not include a separate adjusting section 20.

The transistor 14 may be a FET formed on the semiconductor substrate between an input terminal and an output terminal of the signal processing section 10. The floating electrodes 30 are each formed between a gate electrode of a transistor 14 and the semiconductor substrate. The threshold voltages of the transistors 14 change according to the charge amounts accumulated in the floating electrodes 30.

Therefore, by adjusting the charge amounts accumulated in the floating electrodes 30, the electric characteristic of the signal processing section 10 can be adjusted. In the same manner as described in relation to FIG. 1, the floating electrodes 30 are irradiated with electron beams according to the measurement results of the output signal.

Figure 3:
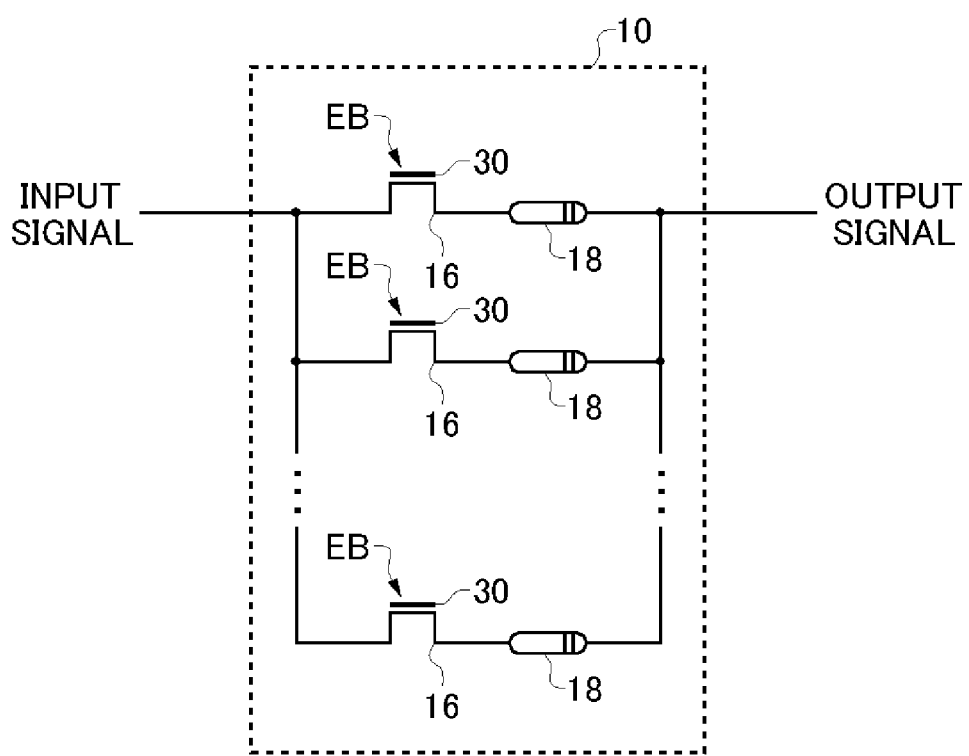
FIG. 3 shows another exemplary configuration of the electronic device 100.

FIG. 3 shows another exemplary configuration of the electronic device 100. The electronic device 100 of the present embodiment includes floating electrodes 30 formed in the signal processing section 10. The electronic device 100 of the present embodiment also includes a plurality of transmission lines 18 and a plurality of switches 16.

The transmission lines 18 each have different electric characteristics, and transmit the input signal in parallel. A plurality of switches 16 correspond to the plurality of transmission lines 18. A floating electrode 30 is formed in each switch 16, and each switch 16 switches whether the input signal is transmitted to the corresponding transmission line 18 according to the charge amount supplied to the floating electrode 30.

With this configuration, the characteristics of the signal processing section 10 can be adjusted by selecting which floating electrodes 30 are irradiated with the electron beam. When the characteristics of the signal processing section 10 are to be changed, the prescribed floating electrodes 30 may be irradiated with the electron beam after floating electrodes 30 that have accumulated charges are irradiated with ultra violet rays to remove the charges therefrom.

Figure 4:
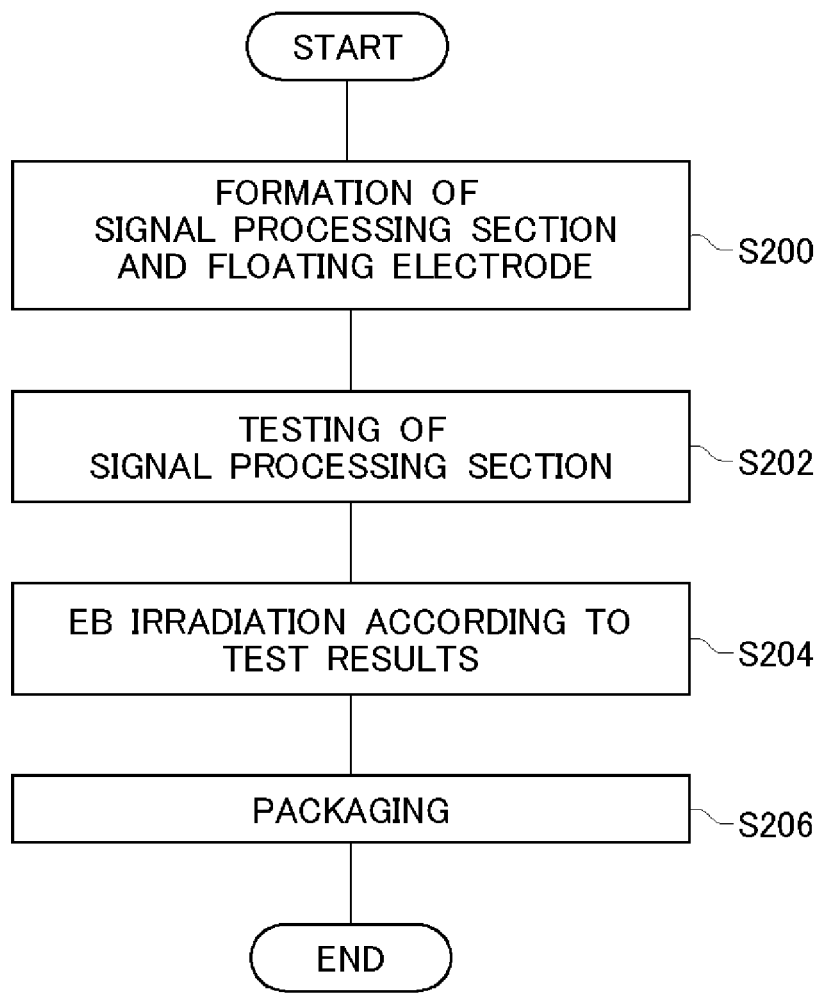
FIG. 4 is a flow chart of an exemplary method for manufacturing the electronic device 100.

FIG. 4 is a flow chart of an exemplary method for manufacturing the electronic device 100. First, the signal processing section 10 and the floating electrode 30s are formed on the semiconductor substrate (S200). Next, the electric characteristics of the signal processing section 10 are measured (S202). The signal processing section 10 receives the input signal, generates an output signal corresponding to the input signal, and corrects the electric characteristics of the output signal according to the charge amount accumulated in the floating electrodes 30.

When an electric characteristic of the signal processing section 10 has an error with respect to the prescribed characteristic, the floating electrode 30 corresponding to this electric characteristic is irradiated with an electron beam with an irradiation amount corresponding to the measurement result (S204). The remaining structure of the electronic device 100 is formed, and the electronic device 100 is packaged (S206). With this process, an electronic device 100 can be formed whose characteristics are adjusted in advance. When manufacturing the electronic device 100 includes using ultra violet rays, the process of irradiating with the electron beam is preferably performed after the process using the ultra violet rays.

Figure 5:
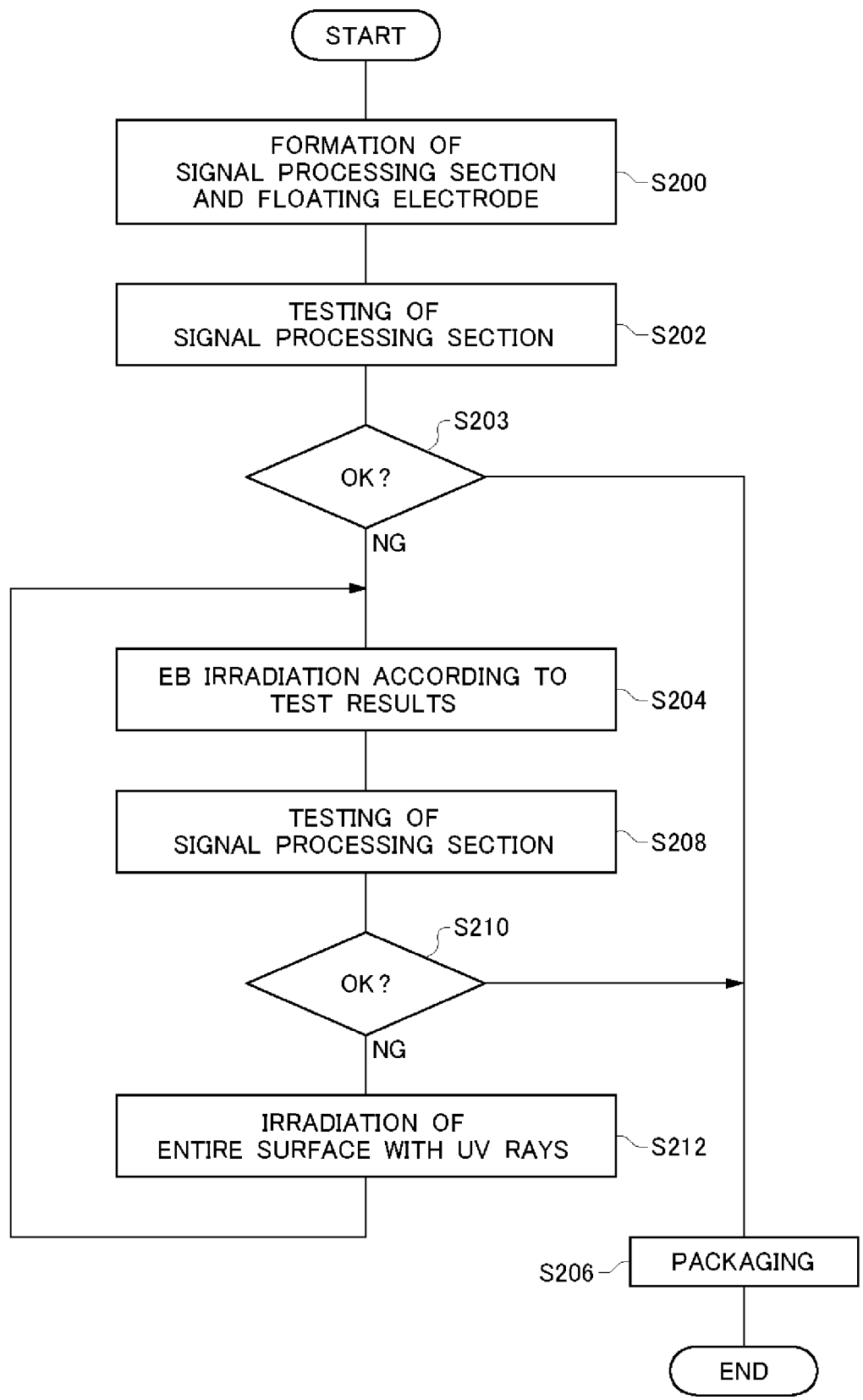
FIG. 5 is another flow chart of an exemplary method for manufacturing the electronic device 100.

FIG. 5 is another flow chart of an exemplary method for manufacturing the electronic device 100. First, the signal processing section 10 and the floating electrodes 30 are formed on the semiconductor substrate (S200). Next, the electric characteristics of the signal processing section 10 are measured (S202). A judgment is then made as to whether the operation of the signal processing section 10 fulfills a predetermined specification (S203). If the operation of the signal processing section 10 fulfills the predetermined specification, the electronic device 100 is packaged (S206) and the process ends.

If the operation of the signal processing section 10 does not fulfill the predetermined specification, the floating electrode 30 corresponding to this operation is irradiated with the electron beam with an irradiation amount corresponding to the measurement result (S204). As a result, the characteristic of the signal processing section 10 is corrected.

Next, the operation of the signal processing section 10 is measured again (S208). A judgment is then made as to whether the operation of the signal processing section 10 fulfills the predetermined specification (S210). At this time, pass/fail of the operation may be judged at S210 for each of a predetermined plurality of regions of the signal processing section 10. If all regions of the signal processing section 10 are judged to be operating properly, the electronic device 100 is packaged (S206) and the process ends.

If the operation of a region of the signal processing section 10 does not fulfill the prescribed specification, the entire top surface of the electronic device 100 or the signal processing section 10 is irradiated with ultra violet rays (S212). As a result, the charge accumulated in each floating electrode 30 is removed. The processes from S204 are then repeated, and each floating electrode 30 is again irradiated with the electron beam.

It should be noted that, from the second repetition of S204 onward, regions of the signal processing section 10 judged to be acceptable at S210 are irradiated using electron beams with the same settings used in the previous iteration. Regions of the signal processing section 10 that are judged to be unacceptable are irradiated with electron beams with different irradiation locations, irradiation times, current amounts, or the like. By repeating this process, each region of the signal processing section 10 can be irradiated with an electron beam having appropriate irradiation conditions.

Figure 6:
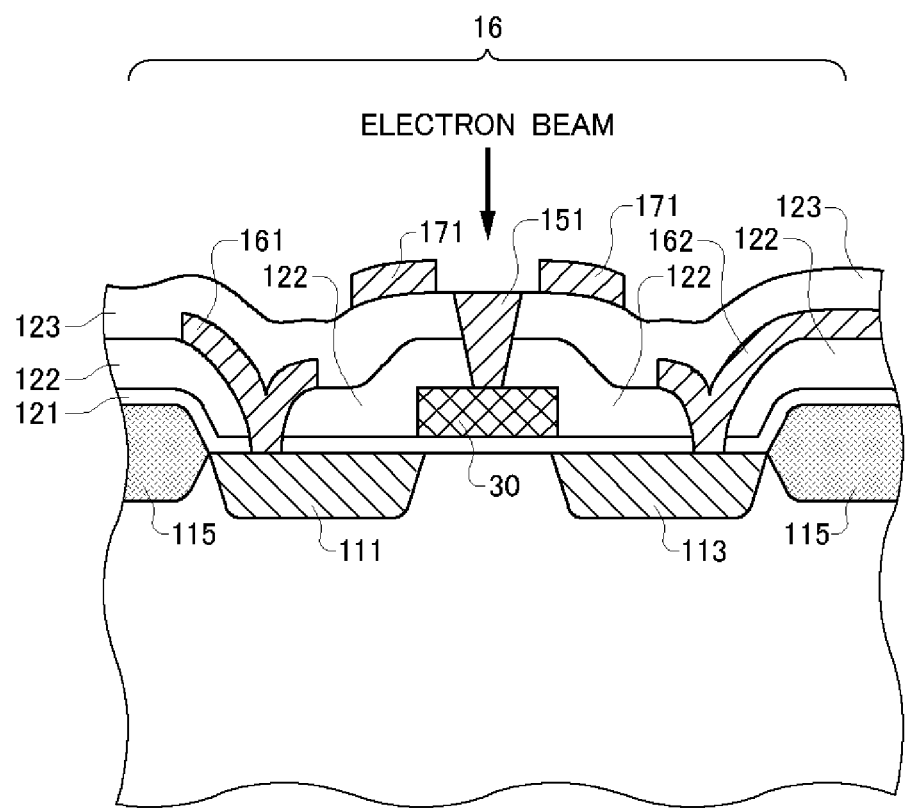
FIG. 6 shows an exemplary configuration of a switch 16.

FIG. 6 shows an exemplary configuration of a switch 16. The switch 16 may be a FET that uses a floating electrode 30 as the gate electrode.

The switch 16 is provided in a region divided by a plurality of isolating regions 115 formed on the semiconductor substrate by insulating material such as silicon dioxide. The switch 16 includes a source region 111, a drain region 113, a floating electrode 30, a via hole 151, and a guard ring 171.

The source region 111 and the drain region 113 are formed at a distance from each other on a top surface layer of the semiconductor substrate. The source region 111 and the drain region 113 may be may be formed by injecting phosphorous ions to a prescribed depth from the top surface of the single-crystal silicon semiconductor substrate. If the switch 16 has n-type channel characteristics, the source region 111 and the drain region 113 may be n-type regions, while the semiconductor substrate is a p-type substrate.

The floating electrode 30 may be provided facing the source region 111 and the drain region 113 across the insulating film 121 formed by depositing the insulating material, such as silicon dioxide, on the semiconductor substrate. In the present embodiment, the floating electrode 30 may be provided between the source region 111 and the drain region 113 in the plane of the semiconductor substrate top surface.

The via hole 151 is formed of a conductive material and penetrates from the top surface of the insulating film 123 to the floating electrode 30. In the present embodiment, the insulating film 122 and the insulating film 123 are formed by depositing insulating material on the floating electrode 30, and the via hole 151 penetrates through the insulating films 122 and 123 such that one end thereof is exposed on the top surface of the insulating film 123.

The pattern wiring 161 and the pattern wiring 162 are provided between the insulating film 122 and the insulating film 123. The pattern wiring 161 electrically connects the source terminal on the semiconductor substrate to the source region 111. The pattern wiring 162 electrically connects the drain terminal to the drain region 113. The source terminal may be connected to the transmission line 18.

The guard ring 171 is formed of a conductive metal, for example, and is provided on the top surface of the insulating film 123 to surround the via hole 151. In the present embodiment, the guard ring 171 may be electrically connected to a reference potential. The guard ring 171 is not limited to having a ring-shape around the via hole 151, as in the present embodiment, and may instead be a square or a polygon.

With this configuration, an electron beam can be irradiated on the via hole 151 exposed from the insulating film 123 to accumulate a charge amount according to the irradiation amount in the floating electrode 30. In this way, the switch 16 can be controlled. Furthermore, since a current and voltage corresponding to the charge amount accumulated in the floating electrode 30 are generated at the source terminal or drain terminal of the switch 16, as described in relation to FIG. 1, the characteristics of the signal processing section 10 may be adjusted based on this voltage or current.

In the present embodiment, when the electron beam irradiates the via hole 151, a portion of the electrons in the electron beam are dispersed in the region around the via hole 151. However, since the conductive guard ring 171 is formed around the via hole 151 as described above, the dispersed electrons are trapped by the guard ring 171. Accordingly, the switch 16 prevents the dispersed electrons from being absorbed in the insulating film 123, for example, so that charge is not accumulated in the insulating film 123 over time.

Figure 7:
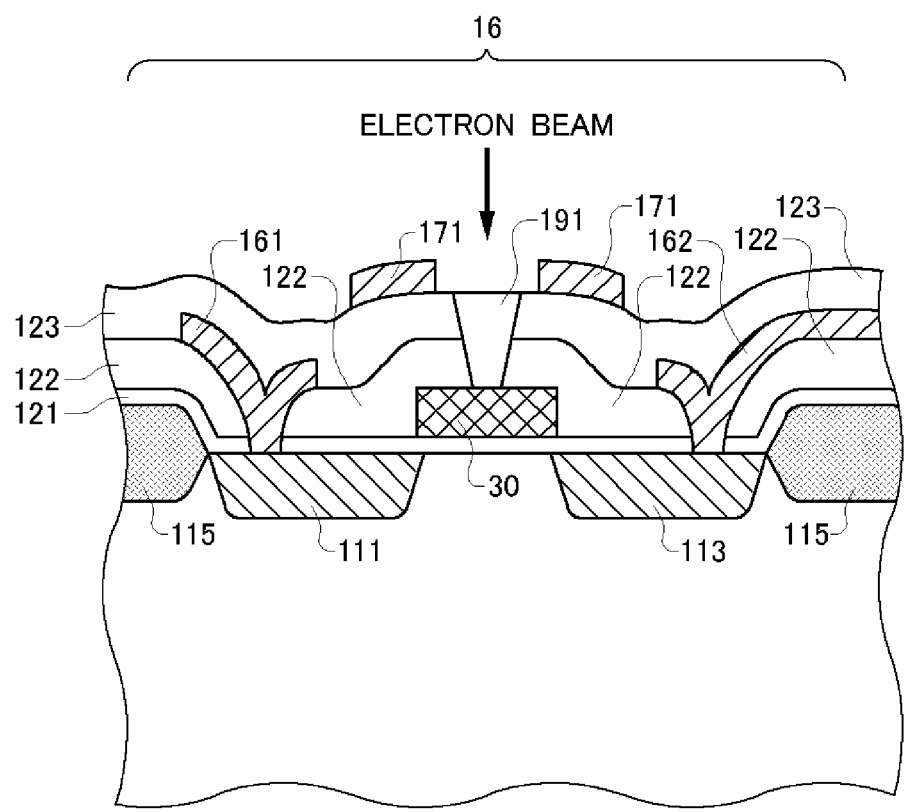
FIG. 7 shows another exemplary configuration of a switch 16.

FIG. 7 shows another exemplary configuration of a switch 16. The entire top surface of the floating electrode 30 described in relation to FIG. 6 is covered by the insulating film 122, but the insulating film 122 covers the floating electrode 30 of the present embodiment such that at least a portion thereof is exposed. For example, as shown in FIG. 7, the switch 16 of the present embodiment may have a through-hole 191 instead of the via hole 151. The remaining configuration may be the same as that of the switch 16 described in FIG. 6.

The through-hole 191 penetrates through the insulating film 122 from the top surface thereof to the top surface of the floating electrode 30. With this configuration as well, an electron beam can irradiate the floating electrode 30 through the through-hole 191 to accumulate a charge amount in the floating electrode 30 corresponding to the irradiation amount. The diameter of the through-hole 191 is preferably greater than the diameter of the electron beam.

Figure 8:
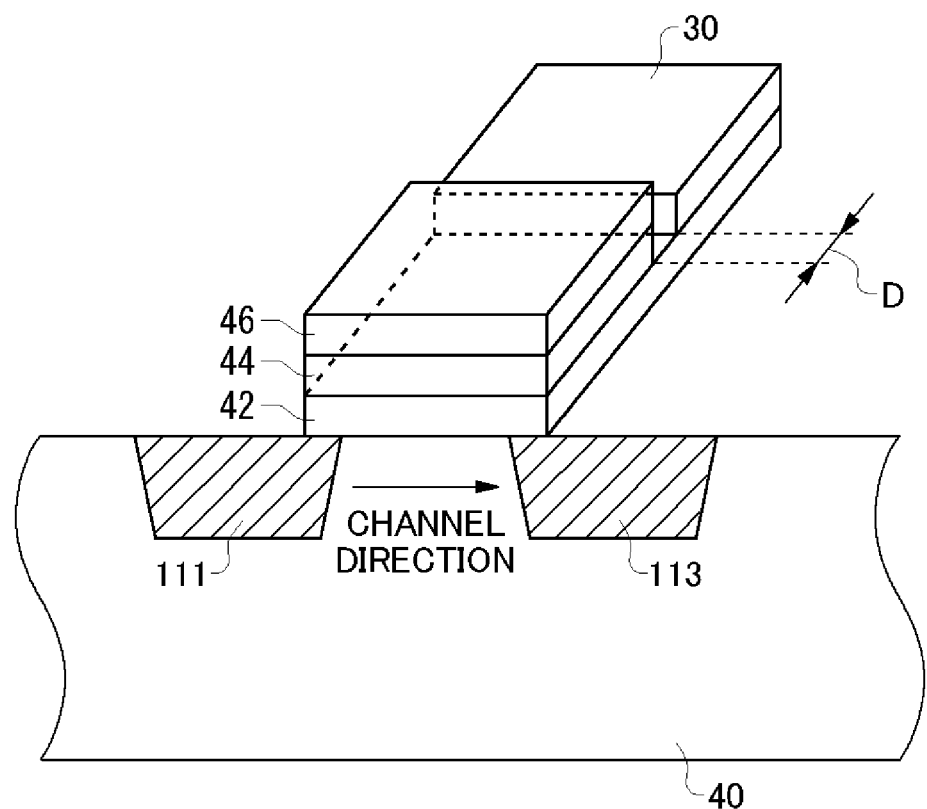
FIG. 8 shows an exemplary configuration of a transistor 14.

FIG. 8 shows an exemplary configuration of a transistor 14. The transistor 14 may be a FET formed on the semiconductor substrate 40. In this case, the gate electrode 44 of the transistor 14 is formed on the top surface of the semiconductor substrate 40 with an insulating film 42 interposed therebetween. A portion of the top surface of the gate electrode 44 may have an insulating film 46 formed thereon.

The floating electrode 30 is formed on the top surface of the semiconductor substrate 40 on which the gate electrode 44 of the transistor 14 is formed. The floating electrode 30 is formed at a distance from the gate electrode 44 of the transistor 14, and also runs parallel to the gate electrode 44 of the transistor 14. As shown in FIG. 8, the floating electrode 30 may be formed at a distance from the gate electrode 44 in a direction perpendicular to the channel direction of the transistor 14. This distance D between the gate electrode 44 and the floating electrode 30 in the direction perpendicular to the channel direction is preferably small enough that the amount of charge in the floating electrode 30 can change the threshold voltage of the transistor 14. A dielectric material may be provided between the floating electrode 30 and the gate electrode 44.

The floating electrode 30 may be formed on the insulating film 42. The insulating film 46 need not be formed on the top surface of the floating electrode 30. In the same manner as in the floating electrodes 30 shown in FIGS. 6 and 7, an insulating film 46 including the via hole 151 or the through-hole 191 may be formed on the top surface of the floating electrode 30. With this configuration, the floating electrode 30 can be easily irradiated with the electron beam to adjust the characteristics of the transistor 14.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An electronic device that generates an output signal corresponding to an input signal, comprising:
  a signal processing section including a transistor formed on a semiconductor substrate between an input terminal that receives the input signal and an output terminal that outputs the output signal corresponding to the input signal, wherein a gate electrode of the transistor is formed on a top surface of the semiconductor substrate;
  a floating electrode that accumulates a charge by being irradiated by an electron beam, wherein the floating electrode (i) is formed on the top surface of the semiconductor substrate, (ii) is formed at a distance from the gate electrode of the transistor in a direction perpendicular to a channel direction of the transistor, and (iii) run parallel to the gate electrode of the transistor;
  an insulating film that covers a top surface of the floating electrode;
  a through-hole formed in the insulating film such that the electron beam can irradiate the floating electrode through the through-hole; and
  a guard ring having a ring shape that surrounds the through-hole on a top surface of the insulating film, has an electrical conductivity, and is operable to trap dispersed electrons of the irradiated electron beam, wherein
  the signal processing section adjusts electric characteristics of the output signal according to a charge amount accumulated in the floating electrode.

2. The electronic device according to claim 1, wherein
  the floating electrode is one of a plurality of floating electrodes,
  the electronic device comprises the plurality of floating electrodes,
  the insulating film covers a top surface of each of the plurality of floating electrodes,
  the through-hole is one of a plurality of through-holes,
  the electronic device comprises the plurality of through-holes, and
  the plurality of through-holes are formed in the insulating film, respectively penetrating from the top surface of the insulating film to a corresponding floating electrode.

3. The electronic device according to claim 1, wherein
  the floating electrode is one of a plurality of floating electrodes,
  the electronic device comprises the plurality of floating electrodes,
  the insulating film covers a top surface of each of the plurality of floating electrodes such that at least a portion of the top surface of each floating electrode is exposed.

4. The electronic device according to claim 1, wherein
  the guard ring is connected to a reference potential.

5. The electronic device according to claim 1, wherein the guard ring has a square-shape or a polygon shape.

6. The electronic device according to claim 1, wherein
  the insulating film includes a first insulating film and a second insulating film,
  the first insulating film covers the top surface of the floating electrode,
  the through-hole is formed in the first and second insulating films, and
  the guard ring surrounds the through-hole on the top surface of the second insulating film.

* * * * *